(12) United States Patent
Moon

(10) Patent No.: US 10,008,517 B2
(45) Date of Patent: Jun. 26, 2018

(54) DISPLAY DEVICE HAVING REDUCED PARASITIC CAPACITANCE AND CROSS-TALK AND METHOD OF MANUFACTURING THE SAME

(71) Applicant: Samsung Display Co., Ltd., Yongin-si, Gyeonggi-do (KR)

(72) Inventor: Sunghoon Moon, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 58 days.

(21) Appl. No.: 14/843,179

(22) Filed: Sep. 2, 2015

(65) Prior Publication Data

US 2016/0211273 A1    Jul. 21, 2016

(30) Foreign Application Priority Data

Jan. 16, 2015  (KR) .......................... 10-2015-0008260

(51) Int. Cl.
*H01L 27/12* (2006.01)
*H01L 27/32* (2006.01)

(52) U.S. Cl.
CPC ........ *H01L 27/124* (2013.01); *H01L 27/1222* (2013.01); *H01L 27/1255* (2013.01); *H01L 27/3244* (2013.01); *H01L 27/1225* (2013.01)

(58) Field of Classification Search
CPC combination set(s) only.
See application file for complete search history.

(56) References Cited

U.S. PATENT DOCUMENTS

2014/0077176 A1*  3/2014  Lee ..................... H01L 27/3262
                                                                    257/40
2014/0167009 A1    6/2014  Lee et al.

FOREIGN PATENT DOCUMENTS

| JP | 2007-233273 A | 9/2007 |
| KR | 10-2012-0110888 A | 10/2012 |
| KR | 10-2014-0077002 A | 6/2014 |

* cited by examiner

*Primary Examiner* — Robert Huber
*Assistant Examiner* — J. R. Oakley
(74) *Attorney, Agent, or Firm* — Knobble, Martens, Olson & Bear, LLP

(57) ABSTRACT

A display device and a method of manufacturing the same are disclosed. In one aspect, the display device includes a plurality of pixels, wherein each pixel includes a scan line extending in a first direction. Each pixel also includes a data line extending in a second direction crossing the first direction and a driving thin-film transistor (TFT) formed adjacent to the data line and including a gate electrode, a source electrode, and a drain electrode. The pixel also includes an interlayer insulating layer formed between the data line and the driving TFT, and a first through hole is formed in the interlayer insulating layer to be adjacent to the data line and the gate electrode. Each pixel also includes a driving voltage line formed adjacent to the data line and including a first portion formed in the first through hole and formed on the interlayer insulating layer.

20 Claims, 12 Drawing Sheets

A - A'

A - A'

A - A'

T1  A1  G1        D1
A – A'

A - A'

A – A'

B – B'

DISPLAY DEVICE HAVING REDUCED PARASITIC CAPACITANCE AND CROSS-TALK AND METHOD OF MANUFACTURING THE SAME

INCORPORATION BY REFERENCE TO ANY PRIORITY APPLICATIONS

This application claims the benefit of Korean Patent Application No. 10-2015-0008260, filed on Jan. 16, 2015, in the Korean Intellectual Property Office, the disclosure of which is incorporated herein in its entirety by reference.

BACKGROUND

Field

The described technology generally relate to a display device and a method of manufacturing the same.

Description of the Related Technology

Recently, a display devices have been used in many consumer products such as smartphones, tablet computers and TVs.

Particularly, demand for display devices having high resolution is increasing, and thus, the size of pixels is decreasing whereas the structure of circuits in the pixels are gradually becoming more complicated.

SUMMARY OF CERTAIN INVENTIVE ASPECTS

One inventive aspect relates to a display device and a method of manufacturing the same.

Another aspect is a display device that includes a plurality of pixels, wherein each of the plurality of pixels includes: a scan line that extends along a first direction; a data line that extends along a second direction, a driving thin-film transistor (TFT) formed adjacent to the data line and includes a gate electrode, a source electrode, and a drain electrode; an interlayer insulating layer between the data line and the driving TFT, and including a through line; and a driving voltage line formed adjacent to the data line and including a first portion, wherein the first portion of the driving voltage line is formed at the through line and located between the data line and the gate electrode of the driving TFT.

In an exemplary embodiment, the data line and the gate electrode of the driving TFT formed on different layers In an exemplary embodiment, the driving voltage line further includes: a second portion that extends along the second direction; and a third portion that protrudes from the second portion and overlaps the gate electrode of the driving TFT, wherein the interlayer insulating layer is formed between the third portion and the gate electrode of the driving TFT.

In an exemplary embodiment, the first portion of the driving voltage line is located at one side of the driving voltage line adjacent to the data line.

In an exemplary embodiment, the first portion of the driving voltage line extends along the second direction while non-overlapping at least one of the source electrode and the drain electrode of the driving TFT.

In an exemplary embodiment, the driving voltage line is formed on a same layer as the data line.

In an exemplary embodiment, the display device further includes a gate insulating layer formed below the gate electrode, wherein the through line exposes a top portion of the gate insulating layer.

In an exemplary embodiment, the interlayer insulating layer further includes a second through line, and the driving voltage line further includes a fourth portion formed at the second through line and located between a data line of a neighboring pixel and the gate electrode of the driving TFT.

In an exemplary embodiment, the first portion and the fourth portion are located at two sides of the driving voltage line along a direction away from each other.

Another aspect is a method of manufacturing a display device including a plurality of pixels includes: forming each of the plurality of pixels, wherein the forming of the each of the plurality of pixels includes: forming a driving thin-film transistor (TFT) including a gate electrode, a source electrode, and a drain electrode, on a substrate; forming an interlayer insulating layer on the driving TFT; forming a through line that penetrates through the interlayer insulating layer and extends along one direction; forming a data line on the interlayer insulating layer; and forming a driving voltage line comprising a first portion formed at the through line, wherein the first portion is located between the data line and the gate electrode of the driving TFT.

In an exemplary embodiment, the driving voltage line further includes a second portion that extends along a same direction as the data line; and a third portion that protrudes from the second portion and overlaps the gate electrode of the driving TFT, wherein the interlayer insulating layer is formed between the gate electrode of the driving TFT and the third portion.

In an exemplary embodiment, the first portion of the driving voltage line is located at one side of the driving voltage line adjacent to the data line.

In an exemplary embodiment, the through line is adjacent to a first side of the gate electrode of the driving TFT and extends along the first side of the gate electrode.

In an exemplary embodiment, the through line does not overlap at least one of the source electrode and the drain electrode of the driving TFT.

In an exemplary embodiment, the driving voltage line and data line are formed on the same layer.

In an exemplary embodiment, the method further comprises forming a gate insulating layer below the gate electrode, wherein the through line exposes a top portion of the gate insulating layer.

In an exemplary embodiment, the method further comprises forming a second through line, wherein the through line and the second through line are located at opposite side of the gate electrode of the driving TFT.

In an exemplary embodiment, in the forming of the driving voltage line, the driving voltage line further includes a fourth portion formed at the second through line and located between a data line of a neighboring pixel and the gate electrode of the driving TFT.

Another aspect is a display device, comprising: a plurality of pixels, wherein each pixel comprises: a scan line extending in a first direction; a data line extending in a second direction crossing the first direction; a driving thin-film transistor (TFT) formed adjacent to the data line and comprising a gate electrode, a source electrode, and a drain electrode; an interlayer insulating layer formed between the data line and the driving TFT, wherein a first through hole is formed in the interlayer insulating layer to be adjacent to the data line and the gate electrode; and a driving voltage line formed adjacent to the data line and comprising a first portion formed in the first through hole and formed on the interlayer insulating layer.

In the above display device, the data line and the gate electrode are formed on different layers.

In the above display device, the driving voltage line further comprises: a second portion extending in the second direction; and a third portion extending from the second portion and overlapping the gate electrode, wherein the interlayer insulating layer is formed between the third portion and the gate electrode.

In the above display device, the first portion of the driving voltage line is located at one side of the driving voltage line adjacent to the data line.

In the above display device, the first portion of the driving voltage line extends in the second direction, wherein the first portion does not overlap at least one of the source electrode and the drain electrode of the driving TFT.

In the above display device, the driving voltage line is formed on the same layer as the data line.

The above display device further comprises a gate insulating layer formed below the gate electrode, wherein the first portion contacts a top portion of the gate insulating layer via the first through hole.

In the above display device, the interlayer insulating layer further comprises a second through hole, wherein the driving voltage line further comprises a fourth portion formed over the second through hole and located between a data line of a neighboring pixel and the gate electrode of the driving TFT.

In the above display device, the first and fourth portions are located at two opposing sides of the driving voltage line.

The above display device further comprises an organic light-emitting diode (OLED) formed over the first portion and the TFT.

Another aspect is a method of manufacturing a display device, the method comprising: forming a plurality of pixels. The forming of the pixels comprises: forming a driving thin-film transistor (TFT) comprising a gate electrode, a source electrode, and a drain electrode, over a substrate; forming an interlayer insulating layer over the driving TFT; forming a first through hole in the interlayer insulating layer; forming a data line over the interlayer insulating layer, wherein the first through hole is adjacent to the data line and the gate electrode; and forming a driving voltage line comprising a first portion formed in the first through hole and formed on the interlayer insulating layer.

In the above method, the driving voltage line further comprises: a second portion extending in the same direction as the data line; and a third portion protruding from the second portion and overlapping the gate electrode of the driving TFT, wherein the interlayer insulating layer is formed between the gate electrode and the third portion.

In the above method, the first portion of the driving voltage line is located at one side of the driving voltage line adjacent to the data line.

In the above method, the first through hole is formed between a first side of the gate electrode of the driving TFT and the data line, and extends from the first side of the gate electrode towards the data line.

In the above method, the first through hole does not overlap at least one of the source electrode and the drain electrode of the driving TFT.

In the above method, the driving voltage line and data line are formed on the same layer.

The above method further comprises forming a gate insulating layer below the gate electrode, wherein the first portion contacts a top portion of the gate insulating layer via the first through hole.

The above method further comprises forming a second through hole, wherein the first and second through holes are located on opposite sides of the gate electrode of the driving TFT.

In the above method, the forming of the driving voltage line includes forming a fourth portion at the second through hole, wherein the fourth portion is located between a data line of a neighboring pixel and the gate electrode of the driving TFT.

Another aspect is a display device, comprising: a scan line extending in a first direction; a data line extending in a second direction crossing the first direction; a driving thin-film transistor (TFT) formed adjacent to the data line and comprising a gate electrode, a source electrode, and a drain electrode; an interlayer insulating layer formed between the data line and the driving TFT, and comprising a first through hole, wherein a portion of the driving voltage line, a portion of the interlayer insulating layer, and the gate electrode of the TFT form a capacitor; and a driving voltage line formed adjacent to the data line and comprising a first portion formed in the first through hole and formed on the interlayer insulating layer.

DETAILED DESCRIPTION OF CERTAIN INVENTIVE EMBODIMENTS

Figure 1:
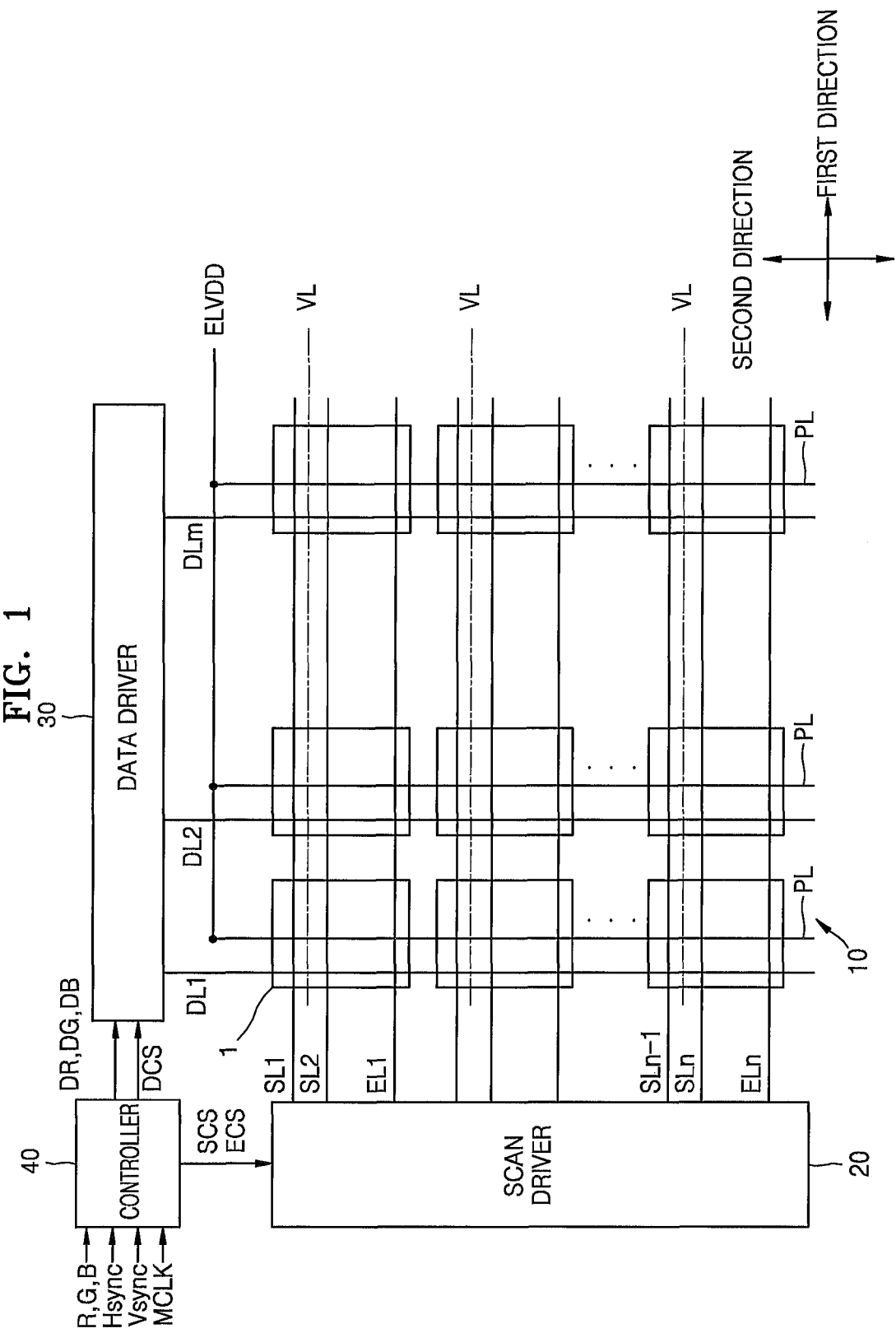
FIG. 1 is a block diagram of a display device according to an exemplary embodiment.

Reference will now be made in detail to embodiments, examples of which are illustrated in the accompanying drawings. In this regard, the present embodiments can have different forms and should not be construed as being limited to the descriptions set forth herein. Accordingly, the embodiments are merely described below, by referring to the figures, to explain aspects of the present description.

In drawings, like reference numerals refer to like elements throughout and overlapping descriptions shall not be repeated.

It will be understood that although the terms "first", "second", etc. can be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components can be present.

Sizes of elements in the drawings can be exaggerated for convenience of explanation. In other words, since sizes and thicknesses of components in the drawings are arbitrarily illustrated for convenience of explanation, the following embodiments are not limited thereto.

When a certain embodiment can be implemented differently, a specific process order can be performed differently from the described order. For example, two consecutively described processes can be performed substantially at the same time or performed in an order opposite to the described order.

When films, regions, or components are connected to each other, the films, the regions, or the components can not only be directly connected to each other, but can also be indirectly connected to each other as another film, another region, or another component is formed therebetween. For example, when films, regions, or components are electrically connected to each other, the films, the regions, or the components can not only be directly electrically connected to each other, but can also be indirectly electrically connected to each other as another film, another region, or another component is formed therebetween. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 is a block diagram of a display device according to an exemplary embodiment. Depending on embodiments, certain elements may be removed from or additional elements may be added to the display device illustrated in FIG. 1. Furthermore, two or more elements may be combined into a single element, or a single element may be realized as multiple elements.

Referring to FIG. 1, the display device includes a display unit 10 including a plurality of pixels 1, a scan driver 20, a data driver 30, and a controller 40.

The display unit 10 includes the pixels 1 that are arranged approximately in a matrix shape by being located at intersections of a plurality of first through nth scan lines SL1 through SLn, a plurality of first through mth data lines DL1 through DLm, and a plurality of first through nth emission control lines EL1 through ELn. The first through nth scan lines SL1 through SLn and the first through nth emission control lines EL1 through ELn extend in a first direction that is a row direction, and the first through mth data lines DL1 through DLm and a driving voltage line PL extend in a second direction that is a column direction or crossing the first direction. In one pixel line, a value of n in the first through nth scan lines SL1 through SLn and a value of n in the first through nth emission control lines EL1 through ELn can be different from each other.

Each pixel 1 can be connected to two of the first through nth scan lines SL1 through SLn transmitted to the display unit 10. In FIG. 1, the pixel 1 is connected to a scan line corresponding to a respective pixel line and a scan line of a previous pixel line, but an exemplary embodiment is not limited thereto.

Each pixel 1 can be connected to one of the first through mth data lines DL1 through DLm, and one of the first through nth emission control lines EL1 through ELn. Also, each pixel 1 can be connected to one of a plurality of initialization voltage lines VL that supply an initialization voltage, and one of the driving voltage lines PL that supply a first power voltage ELVDD. Although not shown in FIG. 1, according to an exemplary embodiment, two adjacent pixels 1 can share one initialization voltage line VL.

The scan driver 20 can generate and transmit two corresponding scan signals to each pixel 1 through the first through nth scan lines SL1 through SLn. For example, the scan driver 20 transmits a first scan signal Sn through a scan line corresponding to a row line to which each pixel 1 is included, and a second scan signal Sn−1 through a scan line corresponding to a previous row line. For example, the scan driver 20 transmits, to the pixel 1 formed on an mth column line and an nth row line, the first scan signal Sn through the nth scan line SLn and the second scan signal Sn−1 through the n−1th scan line SLn−1. The scan driver 20 can generate and transmit an emission control signal to each pixel 1 through the first through nth emission control lines EL1 through ELn.

In some embodiments, a scan signal and an emission control signal are generated by the scan driver 20, but embodiments are not limited thereto. According to another exemplary embodiment, the display device further includes an emission control driver (not shown) that generates an emission control signal.

The data driver 30 can transmit a data signal to each pixel 1 through the first through mth data lines DL1 through DLm.

The controller 40 can convert a plurality of external image signals R, G, and B to a plurality of image data signals DR, DG, and DB, and transmit the image data signals DR, DG, and DB to the data driver 30. Also, the controller 40 can generate control signals for controlling the scan driver 20 and the data driver 30 and transmit the control signals to the scan driver 20 and the data driver 30, upon receiving a vertical synchronization signal Vsync, a horizontal synchronization signal Hsync, and a clock signal MCLK. The controller 40 can generate and transmit a scan driving control signal SCS and the emission driving control signal ECS to the scan driver 20, and a data driving control signal DCS to the data driver 30.

Each pixel 1 can receive the first power voltage ELVDD and a second power voltage ELVSS (referring FIG. 2) from external sources. The first power voltage ELVDD can be a certain high level voltage, and the second power voltage ELVSS can be a voltage lower than the first power voltage ELVDD or a ground voltage.

Figure 2:
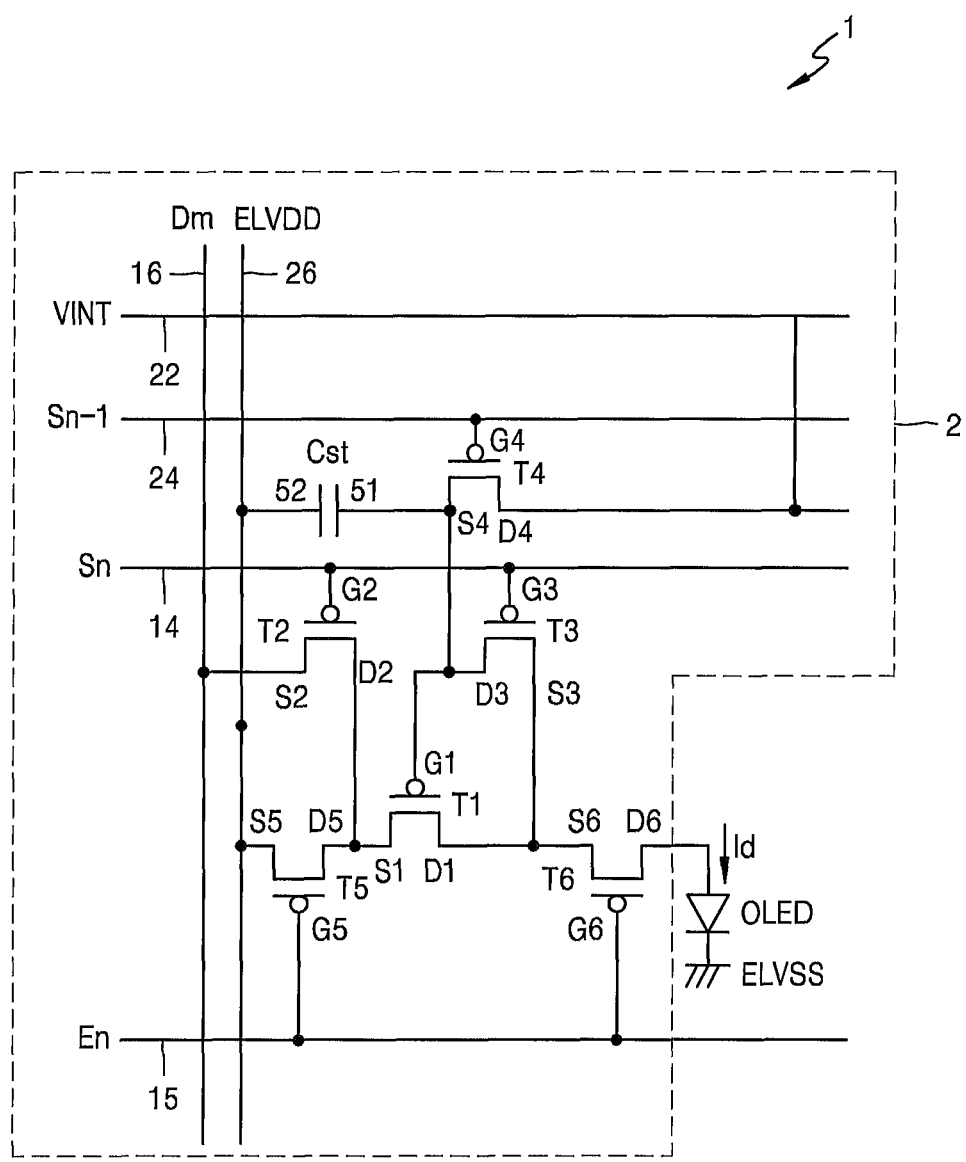
FIG. 2 is an equivalent circuit diagram of one pixel of a display device, according to an exemplary embodiment.

Each of the plurality of pixels 1 can emit light having certain luminance by a driving current Id of FIG. 2 supplied to an OLED according to a data signal Dm transmitted through the first through mth data lines DL1 through DLm.

FIG. 2 is an equivalent circuit diagram of one pixel 1 of the display device, according to an exemplary embodiment.

The pixel 1 can include a pixel circuit 2 including a plurality of thin-film transistors (TFTs) and a storage capacitor Cst. Also, the pixel 1 can include the OLED that emits light upon receiving a driving voltage through the pixel circuit 2.

The TFTs can include a driving TFT T1 and a plurality of switching TFTs. The switching TFTs can include a data transmitting TFT T2, a compensation TFT T3, an initialization TFT T4, a first emission control TFT T5, and a second emission control TFT T6.

The pixel 1 can include a first scan line 14 that transmits the first scan signal Sn to the data transmitting TFT and the compensation TFT T3, and a second scan line 24 that transmits the second scan signal Sn−1 to the initialization TFT T4. The pixel 1 can also include an emission control line 15 that transmits an emission control signal En to the first emission control TFT and the second emission control TFT T6, a data line 16 that transmits the data signal Dm, a driving voltage line 26 that transmits the first power voltage ELVDD, and a initialization voltage line 22 that transmits an initialization voltage VINT for initializing the driving TFT T1.

A gate electrode G1 of the driving TFT T1 is connected to a first electrode 51 of the storage capacitor Cst. A source electrode S1 of the driving TFT T1 is connected to the driving voltage line 26 through the first emission control TFT T5. A drain electrode D1 of the driving TFT T1 is electrically connected to an anode of the OLED through the second emission control TFT T6. The driving TFT T1 receives the data signal Dm according to a switching operation of the data transmitting TFT T2, and supplies the driving current Id to the OLED.

A gate electrode G2 of the data transmitting TFT T2 is connected to the first scan line 14. A source electrode S2 of the data transmitting TFT T2 is connected to the data line 16. A drain electrode D2 of the data transmitting TFT T2 is connected to the source electrode S1 of the driving TFT T1 while being connected to the driving voltage line 26 through the first emission control TFT T5. The data transmitting TFT T2 is turned on by the first scan signal Sn received through the first scan line 14, and performs a switching operation of transmitting the data signal Dm transmitted to the data line 16 to the source electrode S1 of the driving TFT T1.

A gate electrode G3 of the compensation TFT T3 is connected to the first scan line 14. A source electrode S3 of the compensation TFT T3 is connected to the drain electrode D1 of the driving TFT T1 while being connected to the anode of the OLED through the second emission control TFT T6. A drain electrode D3 of the compensation TFT T3 is connected to the first electrode 51 of the storage capacitor Cst, a source electrode S4 of the initialization TFT T4, and the gate electrode G1 of the driving TFT T1. The compensation TFT T3 is turned on by the first scan signal Sn received through the first scan line 14, and diode-connects the driving TFT T1 by connecting the gate electrode G1 and the drain electrode D1 of the driving TFT T1 to each other.

A gate electrode G4 of the initialization TFT T4 is connected to the second scan line 24. A drain electrode D4 of the initialization TFT T4 is connected to the initialization voltage line 22. The source electrode S4 of the initialization TFT T4 is connected to the first electrode 51 of the storage capacitor Cst, the drain electrode D3 of the compensation TFT T3, and the gate electrode G1 of the driving TFT T1. The initialization TFT T4 is turned on by the second scan signal Sn−1 received through the second scan line 24, and performs an initialization operation of initializing a voltage of the gate electrode G1 of the driving TFT T1 by transmitting the initialization voltage VINT to the gate electrode G1 of the driving TFT T1.

A gate electrode G5 of the first emission control TFT T5 is connected to the emission control line 15. A source electrode S5 of the first emission control TFT T5 is connected to the driving voltage line 26. A drain electrode D5 of the first emission control TFT T5 is connected to the source electrode S1 of the driving TFT T1 and the drain electrode D2 of the data transmitting TFT T2.

A gate electrode G6 of the second emission control TFT T6 is connected to the emission control line 15. A source electrode S6 of the second emission control TFT T6 is connected to the drain electrode D1 of the driving TFT T1 and the source electrode S3 of the compensation TFT T3. A drain electrode D6 of the second emission control TFT T6 is electrically connected to the anode of the OLED. The first and second emission control TFTs T5 and T6 are substantially simultaneously or concurrently turned on according to the emission control signal En received through the emission control line 15 to transmit the first power voltage ELVDD to the OLED, and thus the driving current Id flows through the OLED.

A second electrode 52 of the storage capacitor Cst is connected to the driving voltage line 26. The first electrode 51 is connected to the gate electrode G1, the drain electrode D3, and the source electrode S4.

A cathode of the OLED is connected to the second power voltage ELVSS. The OLED displays an image by emitting light by receiving the driving current Id from the driving TFT T1.

Figure 3:
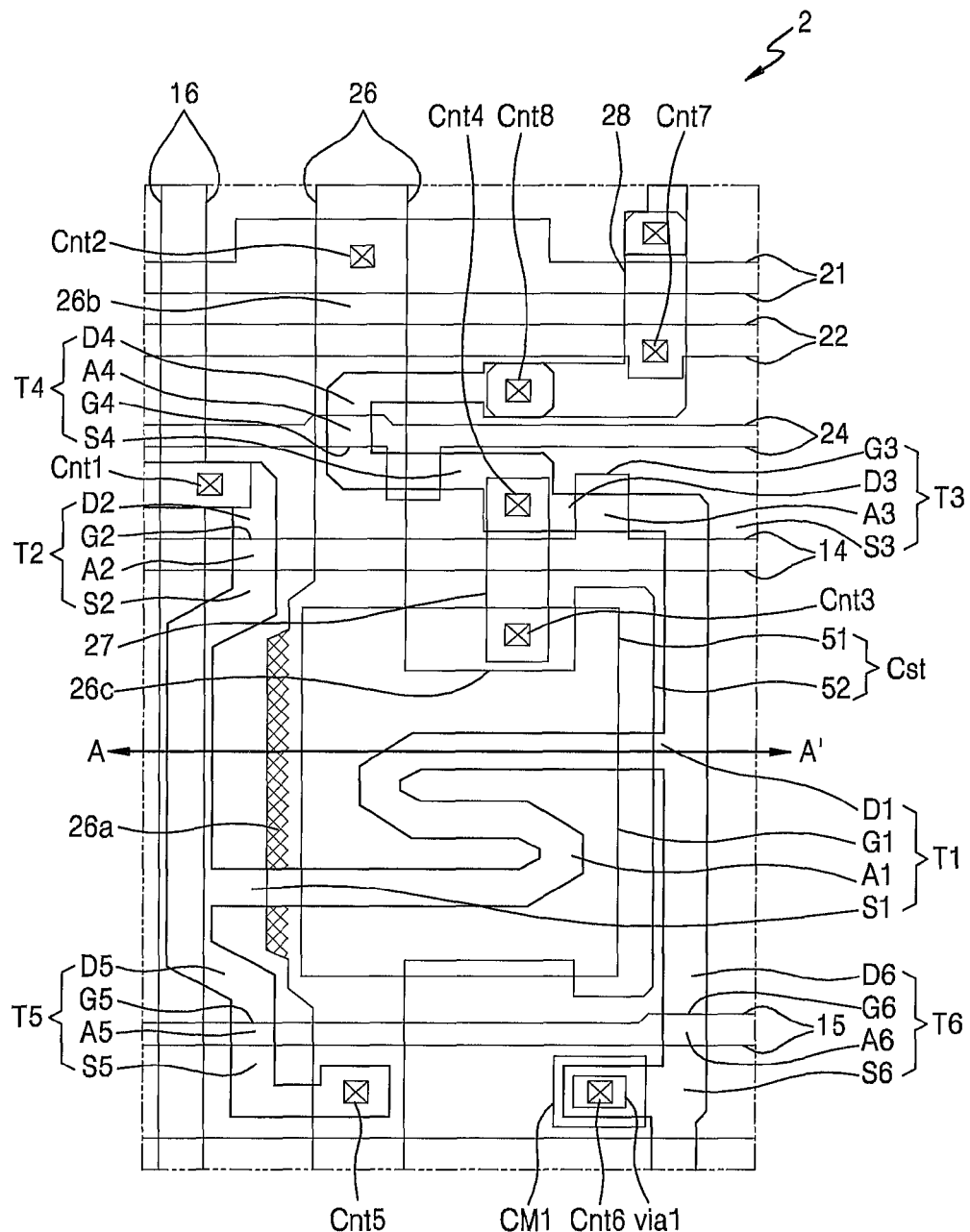
FIG. 3 is a plan view of a pixel circuit included in a display device, according to an exemplary embodiment.

FIG. 3 is a plan view of the pixel circuit 2 included in the display device, according to an exemplary embodiment.

Referring to FIG. 3, the pixel circuit 2 includes a plurality of wires, e.g., the first and second scan lines 14 and 24, the emission control line 15, the data line 16, an auxiliary wire 21, the initialization voltage line 22, and the driving voltage line 26, the driving TFT T1, the switching TFTs, and the storage capacitor Cst.

The first and second scan lines 14 and 24, the emission control line 15, and the initialization voltage line 22 can extend in a first direction, and the data line 16 and the driving voltage line 26 can extend in a second direction. The auxiliary wire 21 extending in a direction crossing the driving voltage line 26, for example, in the first direction, can be formed to prevent a voltage drop (IR drop) of the driving voltage line 26. The auxiliary wire 21 is connected to the driving voltage line 26 through a second contact hole Cnt2.

The first and second scan lines 14 and 24, the emission control line 15, the auxiliary wire 21, and the initialization voltage line 22 can be formed of the same material and on the same layer. The first electrode 51 of the storage capacitor Cst can be formed of the same material and on the same layer as the first and second scan lines 14 and 24, the emission control line 15, and the initialization voltage line 22.

The data line 16 and the driving voltage line 26 can be formed of the same material and on the same layer. The second electrode 52 can be formed of the same material and on the same layer as the data line 16 and the driving voltage line 26.

The driving TFT T1 includes an active layer A1, the gate electrode G1, the source electrode S1, and the drain electrode D1. The source electrode S1 corresponds to a source region doped with impurities in the active layer A1, and the drain electrode D1 corresponds to a drain region doped with impurities in the active layer A1. In the active layer A1, a region between the source region and the drain region is a channel region. The gate electrode G1 can be connected to the storage capacitor Cst. For example, the gate electrode G1 performs functions as the first electrode 51. The gate electrode G1 is connected to the drain electrode D3 of the compensation TFT T3 and the source electrode S4 of the initialization TFT T4 through a first bridge wire 27. The first bridge wire 27 can be formed of the same material and on the same layer as the data line 16.

The data transmitting TFT T2 includes an active layer A2, the gate electrode G2, the source electrode S2, and the drain electrode D2. The source electrode S2 corresponds to a source region doped with impurities in the active layer A2, and the drain electrode D2 corresponds to a drain region doped with impurities in the active layer A2. The source electrode S2 is connected to the data line 16 through a first contact hole Cnt1. The drain electrode D2 is connected to the driving TFT T1 and the first emission control TFT T5. A part or portion of the first scan line 14 operates as the gate electrode G2.

The compensation TFT T3 includes an active layer A3, the gate electrode G3, the source electrode S3, and the drain electrode D3. The source electrode S3 corresponds to a source region doped with impurities in the active layer A3, and the drain electrode D3 corresponds to a drain region doped with impurities in the active layer A3. A part of the first scan line 14 and a part protruding and extending from the first scan line 14 form a gate electrode G3 that is a dual gate electrode to prevent leakage current.

The initialization TFT T4 includes an active layer A4, the gate electrode G4, the source electrode S4, and the drain electrode D4. The source electrode S4 corresponds to a source region doped with impurities in the active layer A4, and the drain electrode D4 corresponds to a drain region doped with impurities in the active layer A4. The drain electrode D4 can be connected to the initialization voltage line 22 through a second bridge wire 28 connected to seventh and eighth contact holes Cnt7 and Cnt8, and the source electrode S4 can be connected to the gate electrode G1 through the first bridge wire 27. A part or portion of the second scan line 24 can operate as the gate electrode G4 of the initialization TFT T4. The second bridge wire 28 can be formed of the same material and on the same layer as the data line 16.

The first emission control TFT T5 includes an active layer A5, the gate electrode G5, the source electrode S5, and the drain electrode D5. The source electrode S3 corresponds to a source region doped with impurities in the active layer A5, and the drain electrode D5 corresponds to a drain region doped with impurities in the active layer A5. The source electrode S5 can be connected to the driving voltage line 26 through a fifth contact hole Cnt5. A part or portion of the emission control line 15 can operate as the gate electrode G5.

The second emission control TFT T6 includes an active layer A6, the gate electrode G6, the source electrode S6, and the drain electrode D6. The source electrode S6 corresponds to a source region doped with impurities in the active layer A6, and the drain electrode D6 corresponds to a drain region doped with impurities in the active layer A6. The drain electrode D6 is connected to a first cover metal CM1 through a sixth contact hole Cnt6, and the first cover metal CM1 can be connected to the anode of the OLED through a first via hole via1. A part or portion of the emission control line 15 operates as the gate electrode G6. The first cover metal CM1 can be formed of the same material and on the same layer as the data line 16 and the driving voltage line 26.

The first electrode 51 can be directly connected to the gate electrode G1 and can overlap the active layer A1. The gate electrode G1 can substantially simultaneously or concurrently perform functions as the first electrode 51 of the storage capacitor Cst. The first electrode 51 is connected to the initialization TFT T4 through the first bridge wire 27 that contacts through third and fourth contact holes Cnt3 and Cnt4. The third contact hole Cnt3 is formed on the gate electrode G1 so as to expose a part or portion of the gate electrode G1 (or the first electrode 51 of the storage capacitor Cst).

The second electrode 52 of the storage capacitor Cst is located on the first electrode 51 to overlap the first electrode 51. The second electrode 52 can be electrically connected to the driving voltage line 26.

The second electrode 52 can be integrally formed with the driving voltage line 26. For example, the driving voltage line 26 is formed adjacent to the data line 16 and includes a portion (hereinafter, referred to as a second portion 26b) that extends along the second direction and provides the first power voltage ELVDD as a wire. The driving voltage line 26 also includes a portion (hereinafter, referred to as a third portion 26c) that protrudes from the second portion 26b in the first direction and is located on the first electrode 51 to overlap the first electrode 51. The third portion 26c can be a second electrode 52 of the storage capacitor Cst.

The driving voltage line 26 can include a shielding portion (hereinafter, referred to as a first portion 26a) for blocking generation of parasitic capacitance between the data line 16 and the gate electrode G1 of the driving TFT T1.

According to an increase in demand for a display device having high resolution, a number of signal wires applying a gate driving signal or a data driving signal increases, and moreover, as a number of TFTs increases, parasitic capacitance can be generated between the signal wires and the TFTs. In detail, when parasitic capacitance is generated due to vertical cap coupling between the gate electrode G1 and the data line 16, which are located on different layers, the parasitic capacitance can affect the gate electrode G1 of the driving TFT T1, and thus cross-talk can be generated.

However, according to an exemplary embodiment, the first portion 26a of the driving voltage line 26 is formed between the data line 16 and the gate electrode G1 of the driving TFT T1, thereby blocking cap coupling therebetween. The first portion 26a can be formed at one side of the driving voltage line 26 adjacent to the data line 16.

Figure 4:
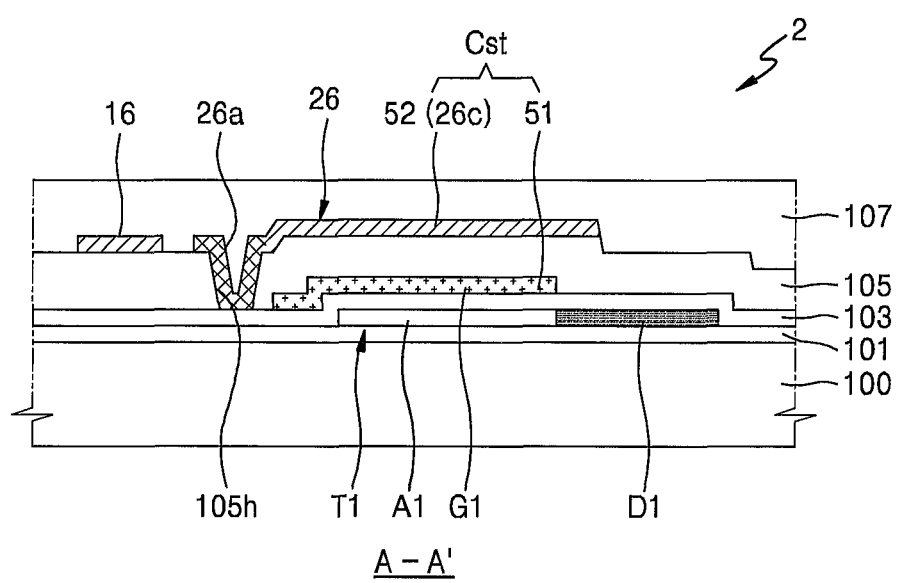
FIG. 4 is a cross-sectional view taken along line A-A' of FIG. 3.

FIG. 4 is a cross-sectional view taken along a line A-A' of FIG. 3.

Referring to FIG. 4, a buffer layer 101 is formed on a substrate 100, and the active layers A1 through A6 of FIG. 3 are formed on the buffer layer 101. FIG. 4 only illustrates a part or portion of the active layer A1, which is not doped or is slightly doped with impurities, and the drain electrode D1, which is doped with impurities.

A gate insulating layer 103 is located on the active layers A1 through A6, and the gate electrode G1 is formed on a top portion of the gate insulating layer 103. Although not shown in FIG. 4, the gate electrodes G2 through G6 of the switching TFTs described above with reference to FIG. 3 are formed together with the gate electrode G1 of the driving TFT T1.

An interlayer insulating layer 105 is located on the gate electrode G1. The data line 16, the driving voltage line 26, and the second electrode 52 are located on the interlayer insulating layer 105. Although not shown in FIG. 4, the first and second bridge wires 27 and 28, and the first cover metal CM1 described above with reference to FIG. 3 are formed together with the data line 16, the driving voltage line 26, and the second electrode 52 of the storage capacitor Cst.

A through line or through hole 105h that penetrates the interlayer insulating layer 105 can be formed at a partial region of the interlayer insulating layer 105, for example, between the data line 16 and the gate electrode G1. A top portion of the gate insulating layer 103 can be exposed through the through line 105h, and the first portion 26a can be formed at the through line 105*h*. The through line 105*h* can extend along a first side of the gate electrode G1, which is adjacent to the data line 16, and thus the first portion 26*a* formed at the through line 105*h* can extend along the first side of the gate electrode G1 between the data line 16 and the gate electrode G1. The first portion 26*a* of the driving voltage line 26 can block vertical cap coupling generated between the data line 16 and the gate electrode G1, and thus cross-talk by vertical cap coupling can be prevented.

In some embodiments, the first portion 26*a* can extend along the second direction but is not located on the source electrode S1. As shown in FIG. 4, since the first portion 26*a* is located on the top portion of the gate insulating layer 103, the first portion 26*a* does not directly contact a doped region of the active layer A1 of the driving TFT T1, for example, the source electrode S1. However, when the gate insulating layer 103 can become very thin as a portion of the gate insulating layer 103 are etched while the through line 105*h* is formed, a short circuit can be generated between the first portion 26*a* and the source electrode S1. However, the first portion 26*a* can be located so as to not overlap the doped region of the driving TFT T1, for example, the source electrode S1, and thus the short circuit between the first portion 26*a* and the source electrode S1 can be prevented.

According to some embodiments, the first portion 26*a* does not overlap the source electrode S1 that is the doped region of the driving TFT T1, but an exemplary embodiment is not limited thereto. According to another exemplary embodiment, when locations of the source electrode S1 and the drain electrode D1 are switched, the first portion 26*a* can be located to not overlap the drain electrode D1 that is the doped region of the driving TFT T1.

The third portion 26*c* can be located on the gate electrode G1 to overlap the gate electrode G1, while the interlayer insulating layer 105 is formed between the third portion 26*c* and the gate electrode G1. The gate electrode G1 can operate as the first electrode 51, and the third portion 26*c* can operate as the second electrode 52.

A planarization film 107 is formed on the data line 16 and the driving voltage line 26. The first via hole via1 that penetrates through the planarization film 107 is formed at the planarization film 107, and the first cover metal CM1 can be exposed through the first via hole via1 as described above with reference to FIG. 3.

Figure 5:
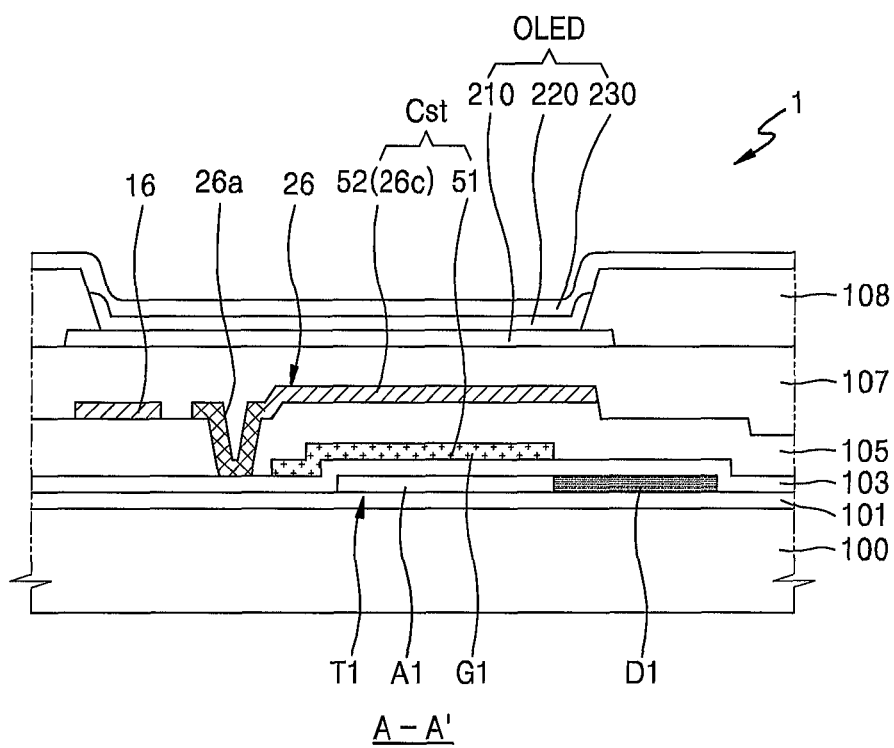
FIG. 5 is a cross-sectional view of an organic light-emitting diode formed on the pixel circuit of FIG. 4.

FIG. 5 is a cross-sectional view of the OLED formed on the pixel circuit 2 of FIG. 4.

Referring to FIG. 5, an anode 210 can be formed on the planarization film 107. As described above with reference to FIG. 3, the anode 210 can be electrically connected to the first cover metal CM1 exposed through the first via hole via1.

A pixel-defining film 108 that covers an edge of the anode 210 and includes an opening exposing a top surface of the anode 210 is formed. An intermediate layer 220 including an organic emission layer is formed at the opening of the pixel-defining film 108. The cathode 230 can be formed on the intermediate layer 220, as a counter electrode.

In some embodiments, the OLED, is formed on the pixel circuit 2 described above with reference to FIGS. 3 and 4, but an exemplary embodiment is not limited thereto. The pixel circuit 2 described above with reference to FIGS. 3 and 4 can be included in a pixel of a liquid crystal display device.

FIGS. 6 through 10 are cross-sectional views for describing a method of manufacturing the display device of FIG. 3, according to an exemplary embodiment.

Figure 6:
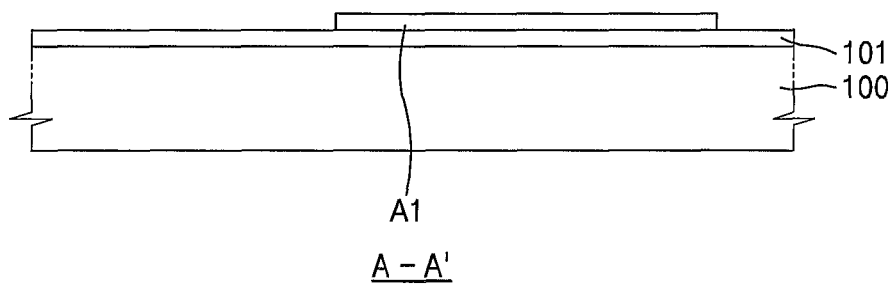
FIGS. 6 through 10 are cross-sectional views for describing a method of manufacturing the display device of FIG. 3, according to an exemplary embodiment.

FIG. 6 is a cross-sectional view for describing a first mask process.

Referring to FIGS. 3 and 6, a semiconductor layer (not shown) is formed on the substrate 100 where the buffer layer 101 is formed, and the semiconductor layer is patterned to form the active layers A1 through A6 of the plurality of TFTs. The active layers A1 through A6 can be an amorphous silicon layer or a polycrystalline silicon layer, or can be an oxide semiconductor layer, such as a $(In2O3)a(Ga2O3)b(ZnO)c$ layer (G-I—Z—O layer), wherein a, b, and c are each a real number satisfying $a≥0$, $b≥0$, and $c>0$.

Figure 7:
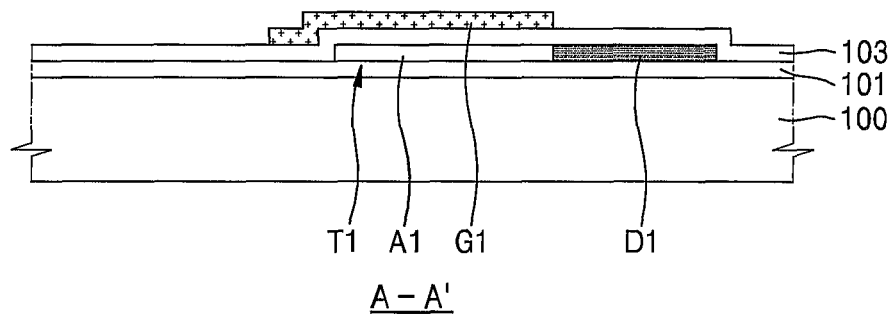

FIG. 7 is a cross-sectional view for describing a second mask process.

Referring to FIGS. 3 and 7, the gate insulating layer 103 is formed on substantially an entire surface of the substrate 100, and a metal layer (not shown) is formed and then patterned to form the first and second scan lines 14 and 24, the emission control line 15, the auxiliary wire 21, the initialization voltage line 22, and the gate electrode G1. Portions of the first and second scan lines 14 and 24, the emission control line 15, the auxiliary wire 21, and the initialization voltage line 22 can form the switching TFTs.

Then, impurities are injected to form the source electrodes S1 through S6 and the drain electrodes D1 through D6. The first and second scan lines 14 and 24, the emission control line 15, the auxiliary wire 21, the initialization voltage line 22, and the gate electrode G1 can be used as self-align masks when the impurities are injected. The impurities vary according to a type of a TFT, and can be N- or P-type impurities.

Figure 8:
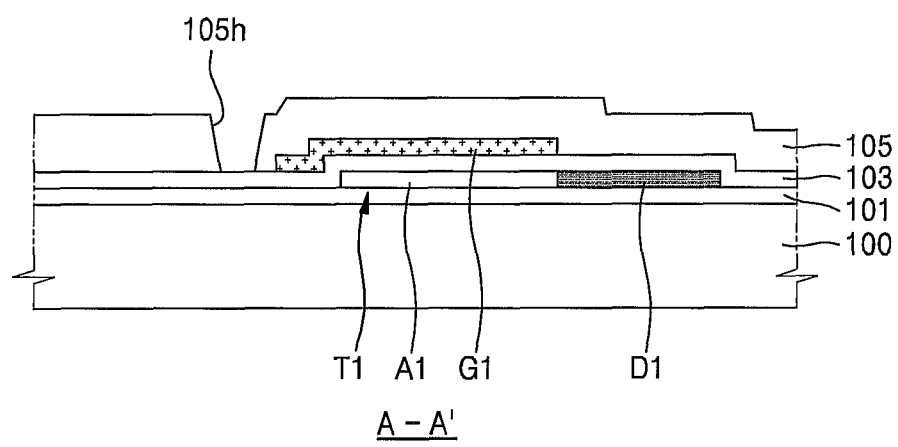

FIG. 8 is a cross-sectional view for describing a third mask process.

Referring to FIGS. 3 and 8, the interlayer insulating layer 105 is formed on substantially the entire surface of the substrate 100, and the through line 105*h* and the first through eighth contact holes Cnt1 through Cnt8 are formed via etching.

The through line 105*h* is formed between the gate electrode G1 and the data line 16 that is formed later, and can extend along the second direction to have a certain length.

Figure 9:
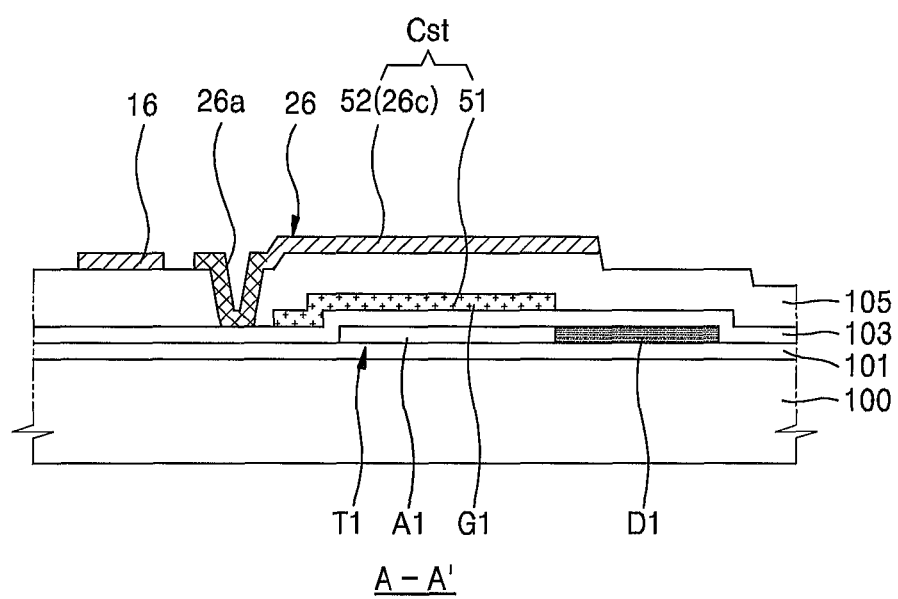

FIG. 9 is a cross-sectional view for describing a fourth mask process.

Referring to FIGS. 3 and 9, a metal layer (not shown) is formed on the interlayer insulating layer 105 and then patterned to form the data line 16, the driving voltage line 26, the first and second bridge wires 27 and 28, and the first cover metal CM1.

The data line 16 and the driving voltage line 26 extend along the second direction. The data line 16 is connected to the source electrode S2 of the data transmitting TFT T2 through the first contact hole Cnt1. The driving voltage line 26 can form a mesh structure with the auxiliary wire 21 through the second contact hole Cn2. The driving voltage line 26 can be connected to the source electrode S5 of the first emission control TFT T5 through the fifth contact hole Cnt5.

The first portion 26*a* can be formed at the through line 105*h* to prevent generation of parasitic capacitance by blocking vertical cap coupling between the data line 16 and the gate electrode G1 of the driving TFT T1.

The second portion 26*b* can extend along the second direction as shown in FIG. 3, and provide the first power voltage ELVDD applied from an external source.

The third portion 26*c* of the driving voltage line 26 can protrude along the first direction from the second portion 26*b*, and overlap the gate electrode G1. The gate electrode G1 and the third portion 26*c* of the driving voltage line 26, wherein the interlayer insulating layer 105 is formed therebetween, can respectively form the first electrode 51 and the second electrode 52 of the storage capacitor Cst.

Figure 10:
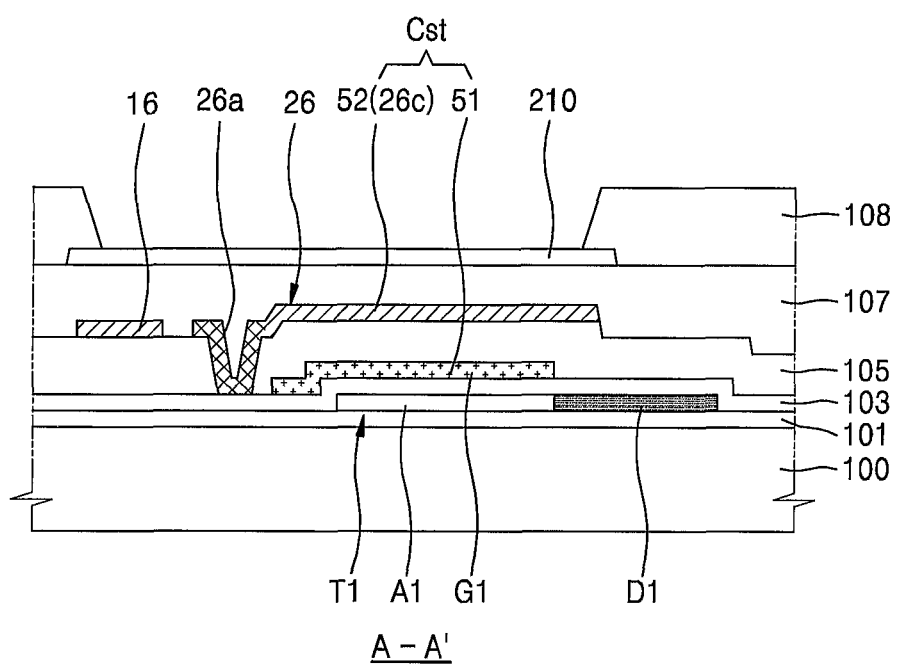

FIG. 10 is a cross-sectional view for describing fifth through seventh mask processes.

Referring to FIGS. 3 and 10, the planarization film 107 is formed on substantially an entire surface of the substrate 100, and the first via hole via1 exposing the first cover metal CM1 is formed (the fifth mask process).

Then, the anode 210 is formed (the sixth mask process), and the pixel-defining film 108 including the opening that exposes the top surface of the anode 210 is formed (the seventh mask process). The anode 210 is connected to the first cover metal CM1 through the first via hole via1, and is connected to the second emission control TFT T6 through the first cover metal CM1.

Then, although not illustrated, an intermediate layer including an organic emission layer can be formed at the opening of the pixel-defining film 108, and then a cathode can be formed on substantially the entire surface of the substrate 100.

Figure 11:
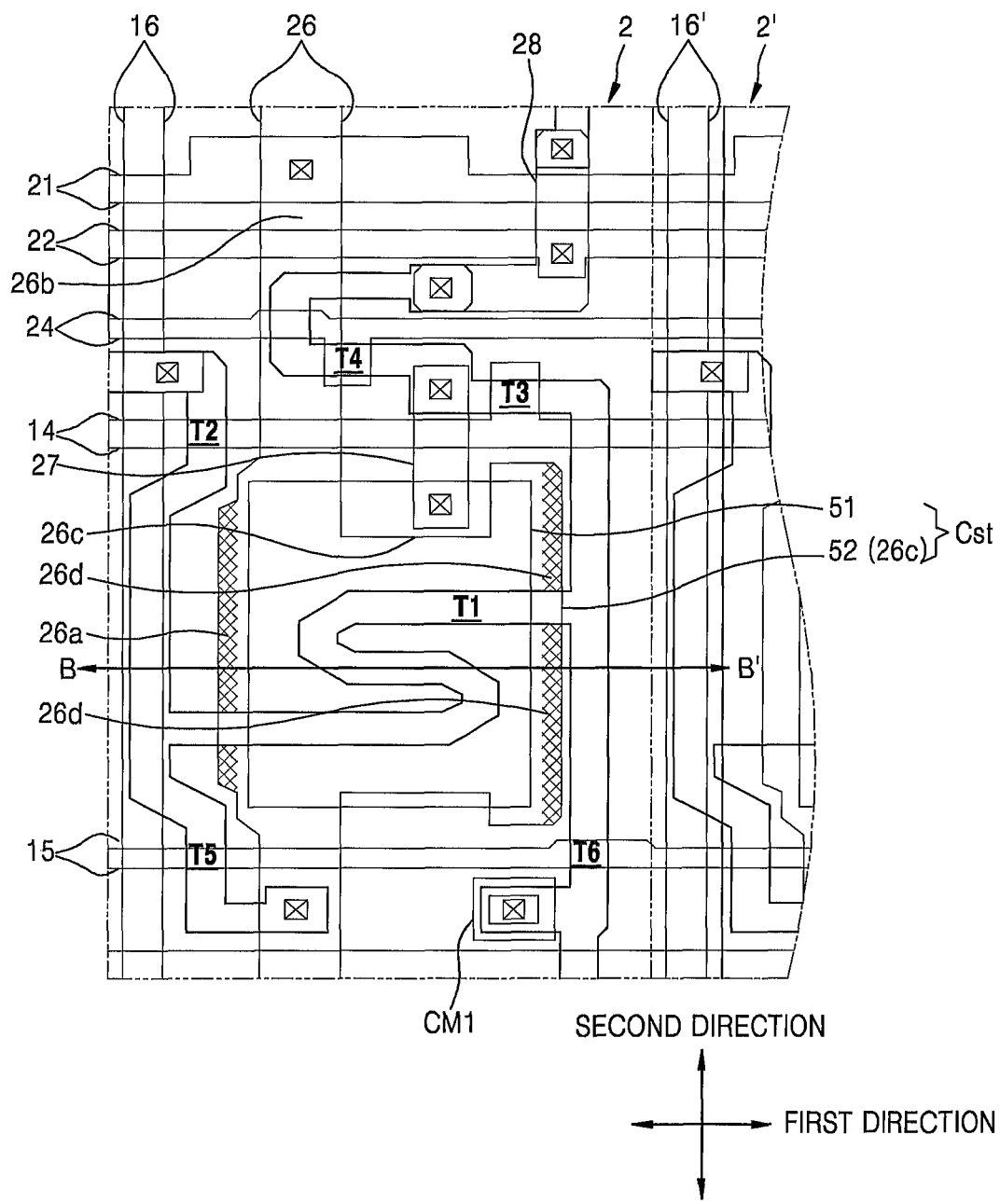
FIG. 11 is a plan view of a pixel circuit included in a display device, according to another exemplary embodiment.
Figure 12:
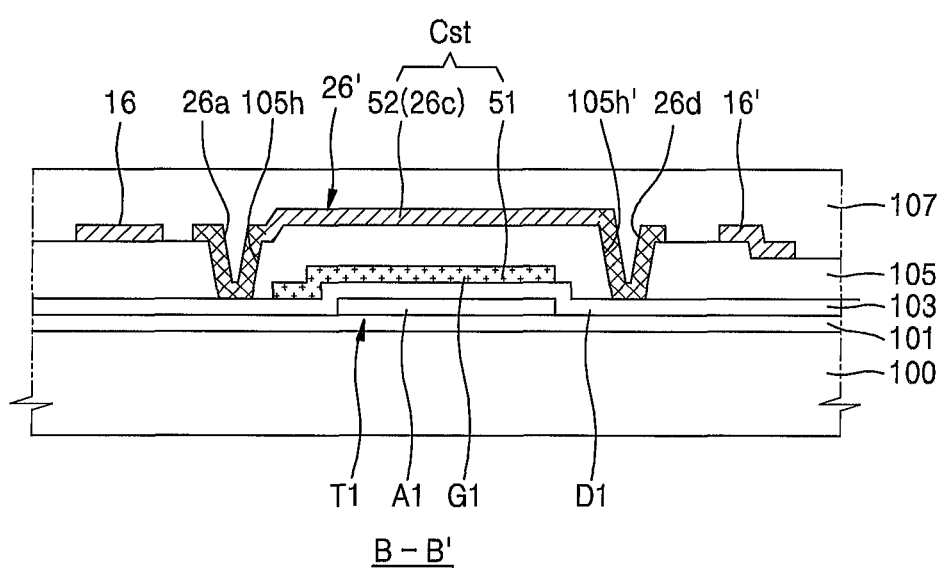
FIG. 12 is a cross-sectional view taken along a line B-B' of FIG. 11.

FIG. 11 is a plan view of the pixel circuit 2 included in a display device, according to another exemplary embodiment. FIG. 12 is a cross-sectional view taken along a line B-B' of FIG. 11. For convenience of description, descriptions about components having the same reference numerals as those of FIGS. 1 through 10 are not provided again and only differences shall be described.

Referring to FIGS. 11 and 12, the driving voltage line 26 can further include a fourth portion 26d for preventing cap coupling between a data line 16' of a neighboring pixel circuit 2' and the gate electrode G1.

The interlayer insulating layer 105 can include the through line 105h described above with reference to FIGS. 3 and 4, and a second through line 105h' located between the data line 16' of the neighboring pixel circuit 2' and the gate electrode G1.

The second portion 26b extends along the second direction to provide the first power voltage ELVDD, and the third portion 26c protruding from the second portion 26b forms the second electrode 52 of the storage capacitor Cst. The first portion 26a and the fourth portion 26d can be formed on two sides of the driving voltage line 26 in a direction away from each other.

The first portion 26a can be formed at the through line 105h, and the fourth portion 26d can be formed at the second through line 105h'. The first portion 26a and the fourth portion 26d can prevent parasitic capacitance generated due to cap coupling between the data lines 16 and 16' and the gate electrode G1 of the driving TFT T1 which is located between the data lines 16 and 16'.

According to at least one of the disclosed embodiments, the first portion 26a and the fourth portion 26d can extend along the second direction while not overlapping the source electrode S1 and the drain electrode D1, which are doped regions of the driving TFT T1.

As described above, generation of parasitic capacitance due to vertical cap coupling, and cross-talk can be prevented.

While the inventive technology has been described with reference to the figures, it will be understood by those of ordinary skill in the art that various changes in form and details can be made therein without departing from the spirit and scope as defined by the following claims.

What is claimed is:

1. A display device, comprising:
a plurality of pixels, wherein each pixel comprises:
a scan line extending in a first direction;
a data line extending in a second direction crossing the first direction;
a driving thin-film transistor (TFT) formed adjacent to the data line and comprising a gate electrode, a source electrode, and a drain electrode;
an interlayer insulating layer formed between the data line and the driving TFT, wherein a first through hole is formed in the interlayer insulating layer to be adjacent to the data line and the gate electrode;
a driving voltage line formed adjacent to the data line and comprising a first portion formed in the first through hole and formed on the interlayer insulating layer; and
an insulating layer formed below the gate electrode, wherein the first portion of the driving voltage line directly contacts a top portion of the insulating layer via the first through hole, and wherein a bottom surface of the first portion of the driving voltage line directly contacts the insulating layer via the first through hole.

2. The display device of claim 1, wherein the data line and the gate electrode are formed on different layers.

3. The display device of claim 1, wherein the driving voltage line further comprises:
a second portion extending in the second direction; and
a third portion extending from the second portion and overlapping the gate electrode, wherein the interlayer insulating layer is formed between the third portion and the gate electrode.

4. The display device of claim 1, wherein the first portion of the driving voltage line is located at one side of the driving voltage line adjacent to the data line.

5. The display device of claim 1, wherein the first portion of the driving voltage line extends in the second direction, and wherein the first portion does not overlap at least one of the source electrode and the drain electrode of the driving TFT.

6. The display device of claim 1, wherein the driving voltage line is formed on the same layer as the data line.

7. The display device of claim 1, wherein the interlayer insulating layer further comprises a second through hole, and
wherein the driving voltage line further comprises a fourth portion formed over the second through hole and located between a data line of a neighboring pixel and the gate electrode of the driving TFT.

8. The display device of claim 7, wherein the first and fourth portions are located at two opposing sides of the driving voltage line.

9. The display device of claim 1, further comprising an organic light-emitting diode (OLED) formed over the first portion and the TFT.

10. The display device of claim 1, wherein the first portion of the driving voltage line is not connected to the drain electrode of the TFT.

11. The display device of claim 1, wherein the first portion of the driving voltage line does not overlap the drain electrode of the TFT in the depth dimension of the display device.

12. A method of manufacturing a display device, the method comprising:
forming a plurality of pixels, wherein the forming of the pixels comprises:
forming a driving thin-film transistor (TFT) comprising a gate electrode, a source electrode, and a drain electrode, over a substrate;

forming an interlayer insulating layer over the driving TFT;

forming a first through hole in the interlayer insulating layer;

forming a data line over the interlayer insulating layer, wherein the first through hole is adjacent to the data line and the gate electrode;

forming a driving voltage line comprising a first portion formed in the first through hole and formed on the interlayer insulating layer; and forming an insulating layer below the gate electrode, wherein the first portion of the driving voltage line directly contacts a top portion of the insulating layer via the first through hole, and wherein a bottom surface of the first portion of the driving voltage line directly contacts the insulating layer via the first through hole.

13. The method of claim 12, wherein the driving voltage line further comprises:

a second portion extending in the same direction as the data line; and a third portion protruding from the second portion and overlapping the gate electrode of the driving TFT, wherein the interlayer insulating layer is formed between the gate electrode and the third portion.

14. The method of claim 12, wherein the first portion of the driving voltage line is located at one side of the driving voltage line adjacent to the data line.

15. The method of claim 12, wherein the first through hole is formed between a first side of the gate electrode of the driving TFT and the data line and extends from the first side of the gate electrode towards the data line.

16. The method of claim 15, wherein the first through hole does not overlap at least one of the source electrode and the drain electrode of the driving TFT.

17. The method of claim 12, wherein the driving voltage line and data line are formed on the same layer.

18. The method of claim 12, further comprising forming a second through hole, wherein the first and second through holes are located on opposite sides of the gate electrode of the driving TFT.

19. The method of claim 18, wherein the forming of the driving voltage line includes forming a fourth portion at the second through hole, wherein the fourth portion is located between a data line of a neighboring pixel and the gate electrode of the driving TFT.

20. A display device, comprising:

a scan line extending in a first direction;

a data line extending in a second direction crossing the first direction;

a driving thin-film transistor (TFT) formed adjacent to the data line and comprising a gate electrode, a source electrode, and a drain electrode;

an interlayer insulating layer formed between the data line and the driving TFT, and comprising a first through hole, wherein a portion of the driving voltage line, a portion of the interlayer insulating layer, and the gate electrode of the TFT form a capacitor;

a driving voltage line formed adjacent to the data line and comprising a first portion formed in the first through hole and formed on the interlayer insulating layer; and an insulating layer formed below the gate electrode, wherein the first portion of the driving voltage line directly contacts a top portion of the insulating layer via the first through hole, and wherein a bottom surface of the first portion of the driving voltage line directly contacts the insulating layer via the first through hole.

* * * * *